United States Patent [19]

Ijichi et al.

[11] 4,291,290

[45] Sep. 22, 1981

[54] UHF-VHF TUNER HAVING DAMPING MEANS TO REDUCE INTERFERENCE IN UHF BAND

[75] Inventors: Sadayoshi Ijichi, Soma; Eiji Nishizawa, Kakuda, both of Japan

[73] Assignee: Alps Electric Company, Ltd., Tokyo, Japan

[21] Appl. No.: 63,148

[22] Filed: Aug. 3, 1979

[30] Foreign Application Priority Data

Aug. 4, 1978 [JP] Japan ................................. 53/95048

[51] Int. Cl.³ .......................... H03J 3/18; H04B 1/10
[52] U.S. Cl. ....................................... 334/1; 334/15; 334/47; 455/190

[58] Field of Search ............... 334/1, 15, 47; 455/188, 455/190, 191, 195, 317

[56] References Cited

U.S. PATENT DOCUMENTS 3,878,466  4/1975  Hendrickson ................. 334/15 X
4,125,863  11/1978  Arumugham ................. 334/16 X Primary Examiner—Paul L. Gensler
Attorney, Agent, or Firm—Guy W. Shoup; Gerard F. Dunne

[57] ABSTRACT

An electronic tuner capable of selectively receiving the UHF band and high and low channels in the VHF band is described which has a suitable resistance provided across power supply terminals in order to improve the separation between the VHF mode and the UHF mode.

6 Claims, 15 Drawing Figures

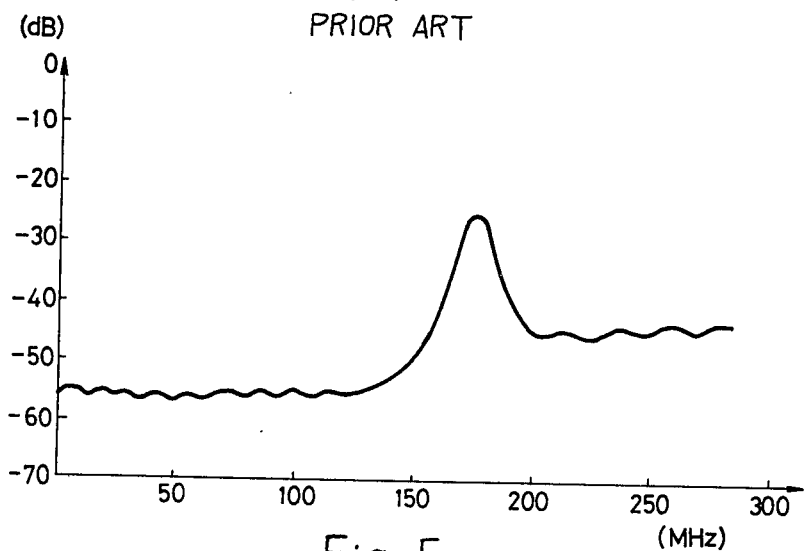
Fig. 5 (A) PRIOR ART
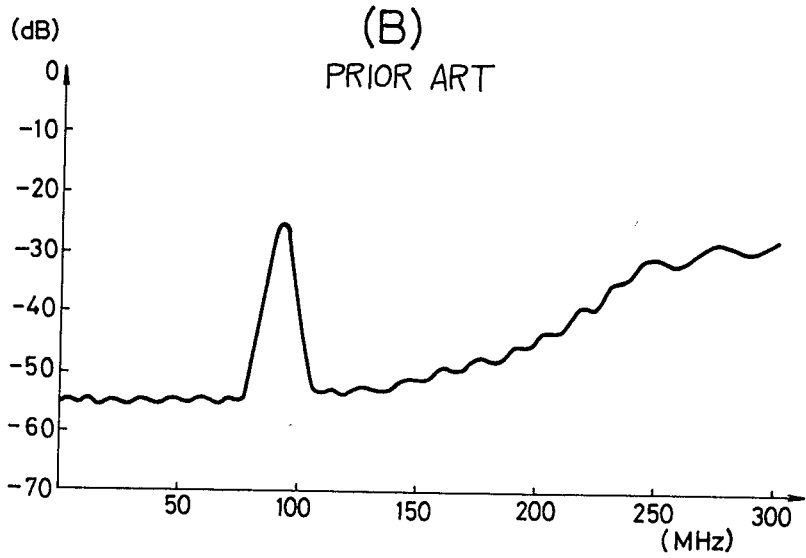
Fig. 5 (B) PRIOR ART (A)

(B)

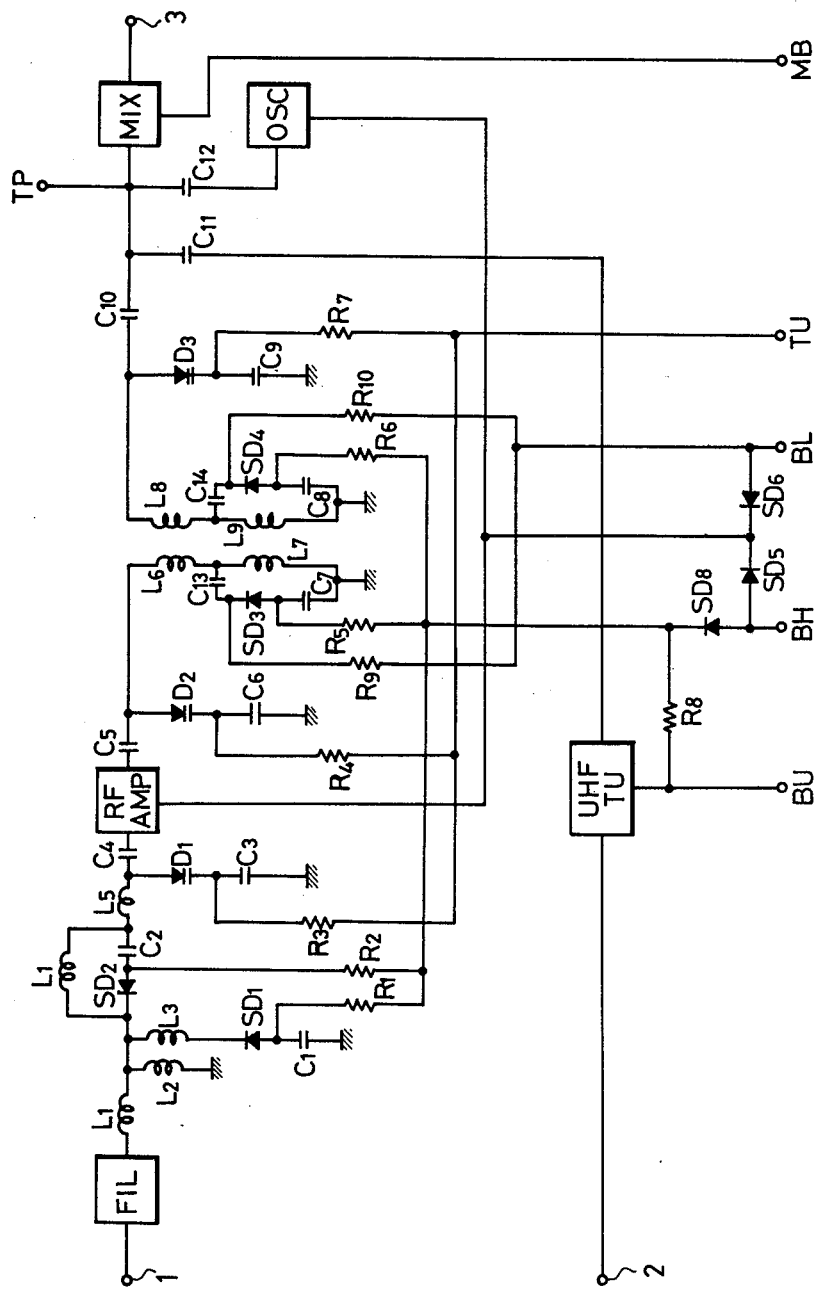

UHF-VHF TUNER HAVING DAMPING MEANS TO REDUCE INTERFERENCE IN UHF BAND

The present invention relates to electronic tuners, and more specifically to electronic tuners suited for receiving channels in the UHF band and for receiving any channel between a low channel and a high channel in the VHF band.

Conventional electronic tuners capable of selectively receiving channels in the UHF band as well as low channels and high channels in the VHF band, and tuners for the VHF band, are equipped with a plurality of tuning circuits consisting of variable capacitance diodes, switching diodes and tuning coils. In these conventional tuners, the inductance of a tuning circuit is increased by applying a reverse bias to the switching diodes in order to receive low channels, or the inductance of the tuning circuits is decreased by applying a forward bias to the switching diodes in order to receive high channels, as will be described more fully below. Further, in receiving the UHF band, a biasing voltage is applied to enable the UHF tuner only so that the UHF band only can be received.

With the above tuners, however, the reception of the UHF band is adversely affected by interference from signals in the VHF band.

The object of the present invention is to provide an electronic tuner capable of receiving both VHF and UHF bands, but which always maintains a good receiving condition when the UHF band is being received by eliminating interference caused by VHF band signals.

According to the present invention, conventional electronic tuners are altered by adding a resistor of high value in a current line to the switching diodes of the conventional tuner. In this way, the switching diodes can function as damper resistors to lower the Q value of the tuning circuits.

BRIEF DESCRIPTION OF THE DRAWINGS

FIGS. 5A and 5B show attenuation characteristics of input signals as measured at a test probe terminal TP of FIG. 4;

FIG. 11 is a circuit diagram of an electronic tuner according to a further embodiment of the present invention.

Prior to describing preferred embodiments of the present invention, conventional electronic tuners are mentioned below with reference to FIGS. 1 to 6.

Figure 1:
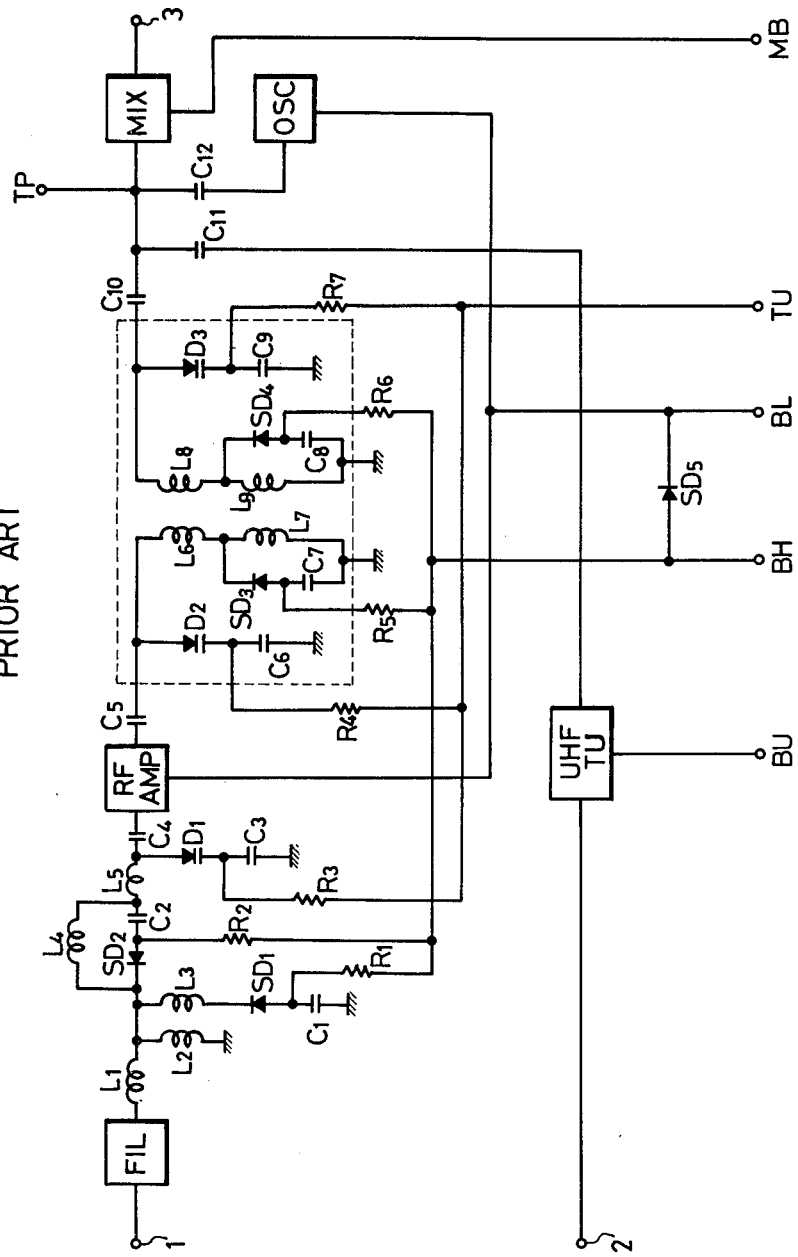
FIG. 1 is a circuit diagram of a conventional electronic tuner.

A conventional electronic tuner has been constructed as shown, for example, in FIG. 1, in which reference numeral 1 designates a VHF input terminal, 2 a UHF input terminal, 3 an output terminal, symbol FIL represents a filter, RF AMP a high-frequency amplifier circuit, OSC a local oscillating circuit, UHF TU a UHF tuner, MIX a mixer circuit, $L_1$ to $L_9$ denote tuning coils, $D_1$ to $D_3$ designate variable capacitance diodes, $SD_1$ to $SD_5$ designate switching diodes, $R_1$ to $R_7$ represent resistors, $C_1$ to $C_{12}$ denote capacitors, symbols BU, BH, BL, MB and TU denote power supply terminals, and symbol TP represents a test probe terminal.

Figure 2:
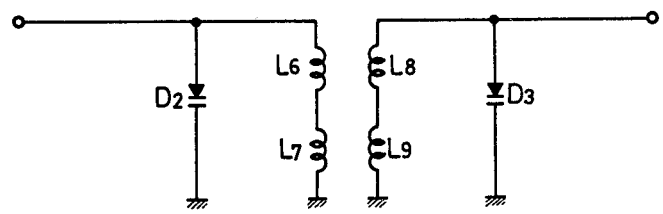
FIG. 2 shows an equivalent circuit for the circuit shown in the dotted line of FIG. 1 when a low channel in the VHF band is being received.

In order to receive a low channel in the VHF band, a voltage of +15 volts is applied across the power supply terminals MB and BL and an operating current will thus be supplied to the mixer circuit MIX, to the high-frequency amplifier circuit RF AMP, and to the local oscillating circuit OSC. Further, the diode $SD_5$ will receive a reverse bias. Therefore, no electric current will be supplied to the diodes $SD_1$ to $SD_4$ and, consequently, the diodes $SD_1$ to $SD_4$ remain in a nonconductive state. The tuner is thus in a state to receive a low channel in the VHF band and by changing the voltage applied to the power supply terminal TU, the capacitances of the variable capacitance diodes $D_1$ to $D_3$ can be varied to effect the tuning. The circuit surrounded by the dotted line in FIG. 1 provides the primary tuning functions and can be equivalently described as shown in FIG. 2. As shown in FIG. 2, a resonance circuit consisting of tuning coils $L_6$ and $L_7$ connected in parallel with variable capacitance diode $D_2$, and a resonance circuit consisting of tuning coils $L_8$ and $L_9$ connected in parallel with variable capacitance diode $D_3$ are themselves connected in parallel.

Figure 3:
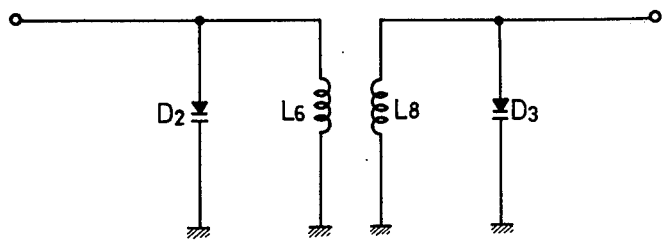
FIG. 3 shows an equivalent circuit for the circuit in the dotted line of FIG. 1 when a high channel in the VHF band is being received.

To receive a high channel in the VHF band, a voltage of +15 volts is applied across the power supply terminals MB and BH and an operating current flows to the mixer circuit MIX. Further, diode $SD_5$ is biased forwardly to supply current to the high-frequency amplifier circuit RF AMP and to the local oscillating circuit OSC, and diodes $SD_1$ to $SD_4$ receive a forward bias and are thus rendered conductive. The tuner is then in a state to receive a high channel in the VHF band. In this case, also, the voltage applied to the variable capacitance diodes $D_1$ to $D_3$ can be changed to effect the tuning. When the high channel is being received, the circuit surrounded by the dotted line in FIG. 1 can be equivalently described as shown in FIG. 3. That is to say, since the diodes $SD_3$ and $SD_4$ are rendered conductive, they provide a shunt path around tuning coils $L_7$ and $L_9$ in order to provide resonance circuits consisting of tuning coil $L_6$ and variable capacitance diode $D_2$, and coil $L_8$ and variable capacitance diode $D_3$, connected in parallel.

Channels in the UHF band can be received by the tuner by applying a voltage of +15 volts across the power supply terminals MB and BU to send operating current to the mixer circuit MIX and the UHF tuner UHF TU, so that the tuner is ready to receive a channel in the UHF band. However, signals are continually sent to the VHF input terminal 1, and they may undesirably be fed through coupling capacitors to the mixer circuit MIX, or signals picked up by the tuning coils may be fed to the mixer circuit MIX. Therefore, reception of the UHF band is affected by signals in the VHF band. In the UHF mode, the electronic tuner shown in FIG. 1 will be effected by a low channel in the VHF band since the diodes $SD_3$ and $SD_4$ in the tuning circuit surrounded by the dotted line will be rendered nonconductive when the UHF band is being received. Accordingly, the reception of UHF band is affected by low channels in the VHF band.

Figure 4:
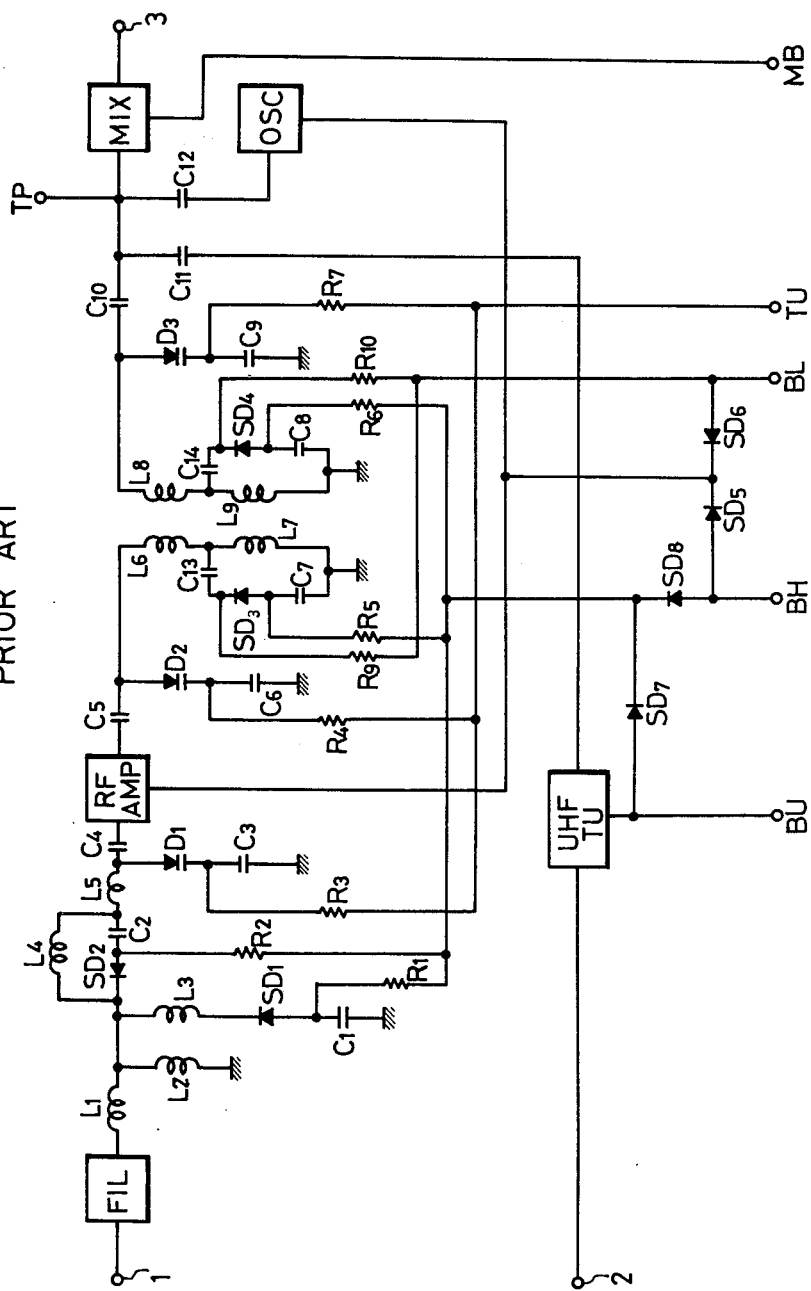
FIG. 4 is a circuit diagram of another conventional electronic tuner.

FIG. 4 shows another conventional tuner, in which symbols $SD_6$ to $SD_8$ denote diodes, $R_9$ and $R_{10}$ denote resistors, $C_1$ to $C_{14}$ signify capacitors, and the same reference numerals or symbols as those of FIG. 1 represent similar elements. The diode $SD_6$ has its cathode connected in series with the cathode of diode $SD_5$ and the voltage of the junction therebetween is applied to the high-frequency amplifier circuit RF AMP and to the local oscillating circuit OSC. The resistors $R_9$ and $R_{10}$ are connected in a manner applying a reverse bias to dioides $SD_3$ and $SD_4$.

When a voltage is applied to the power supply terminals BU and MB to receive the UHF band, a voltage is applied to the diodes $SD_1$ to $SD_4$ via the diode $SD_7$ to render them conductive, whereby the tuner may also receive a high channel in the VHF band. Therefore, signals in the high channel in the VHF band may be fed to the mixer circuit MIX by means of coupling capacitors or the like, or signals picked up by the tuning coils may be added to the mixer circuit MIX, so that the reception is affected by the high channel in the VHF band. FIG. 5A shows attenuation characteristics of signals introduced through the VHF input terminal 1 as measured at a TP (test probe) terminal.

Figure 6:
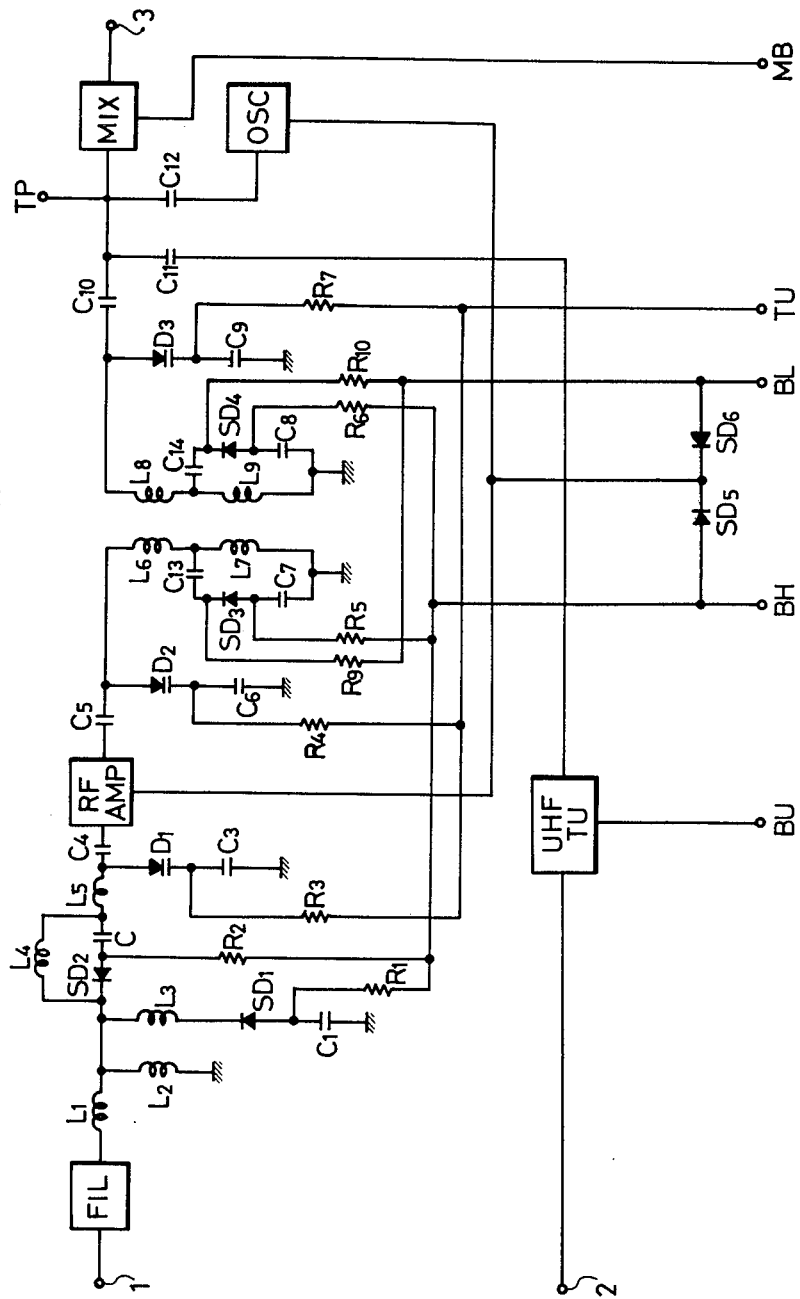
FIG. 6 is a circuit diagram showing a further conventional electronic tuner.

FIG. 6 is a circuit showing a conventional tuner similar to that of FIG. 4 but omitting the diodes $SD_7$ and $SD_8$. When the voltage is applied to the power supply terminals BU and MB to receive the UHF band, the diodes $SD_1$ to $SD_4$ are rendered nonconductive and the tuner circuit is in a state to receive a low channel in the VHF band. Accordingly, signals in the low channel in the VHF band are added to the mixer circuit MIX by means of coupling capacitors or the like, so that the reception of UHF band is affected by the VHF band. FIG. 5B shows attenuation characteristics of input signals introduced through the VHF input terminal 1 as measured at the TP (test probe) terminal. Consequently, the reception of UHF band is adversely affected by signals in the VHF band during use of these conventional tuners.

The object of the present invention therefore is to preclude the abovementioned defects, i.e., to prevent the reception of UHF band from being interfered by signals in the VHF band. Preferred embodiments of the present invention are described below in conjunction with FIGS. 7 to 11.

Figure 7:
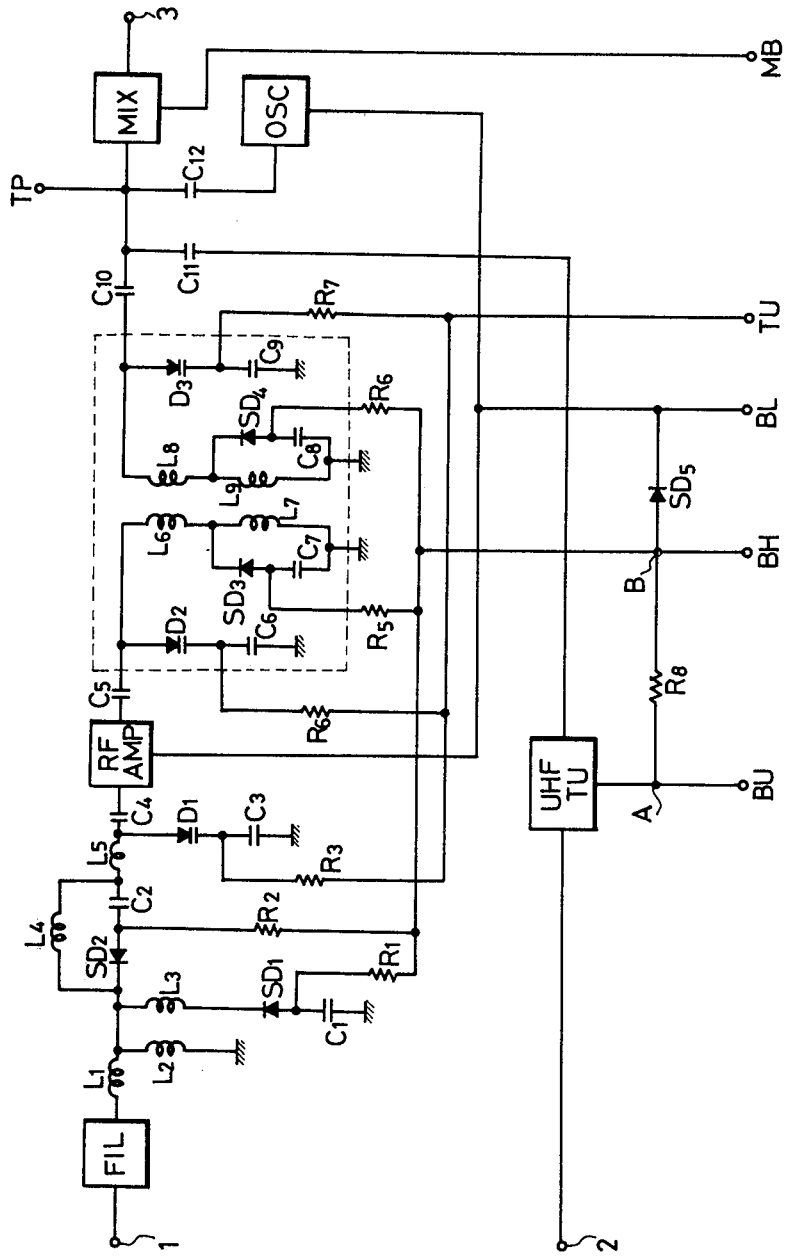
FIG. 7 is a circuit diagram of an electronic tuner according to an embodiment of the present invention.

FIG. 7 is a circuit diagram illustrating one embodiment of the present invention, in which symbol $R_8$ represents a resistor, and the same numerals or symbols as those used in FIG. 1 represent similar elements. The resistor $R_8$ is connected between the power supply terminals BU and BH in order to obtain a given voltage at a point B during operation of the tuner to receive UHF signals, and to apply a predetermined voltage to the diodes $SD_1$ and $SD_4$.

When a voltage of, for example, $+15$ volts is applied to the power supply terminals MB and BL, the tuner circuit acquires a state to receive a low channel in the VHF band in a manner similar to that described above for the conventional tuners. Further, when a voltage of, for example, $+15$ volts is applied to the power supply terminals MB and BH, the tuner circuit acquires a state to receive a high channel in the VHF band in a manner similar to that described above for the conventional tuners. In the circuit of FIG. 7, however, a voltage is applied in the latter case to the UHF TU via the resistor $R_8$. However, if the resistance of the resistor $R_8$ is selected to be several tens of Kohms to several hundreds of Kohms, the potential at the point A can be maintained very small and the electric current is not sufficient to operate the UHF tuner UHF TU, and the reception of the high channel in the VHF band is not interfered by the UHF band.

Further, if a voltage of, for example, $+15$ volts is applied to the power supply terminals MB and BU, operation current is supplied to the mixer circuit MIX and the UHF tuner UHF TU, so that the tuner circuit acquires a state to receive the UHF band. In this case, a forward biasing voltage is applied to the diodes $SD_1$ to $SD_4$ via the resistor $R_8$ and the point B. However, since the resistor $R_8$ has a large resistance (several tens to several hundreds of kiloohms), the voltage at the point B is small, and very small current flows into the diodes $SD_1$ to $SD_4$. Therefore, the diodes $SD_1$ to $SD_4$ are not completely rendered nonconductive. The diodes $SD_1$ to $SD_4$ thus function as resistors, so that the circuit surrounded by a dotted line in FIG. 7 can be equivalently expressed as shown in FIG. 8.

Figure 8:
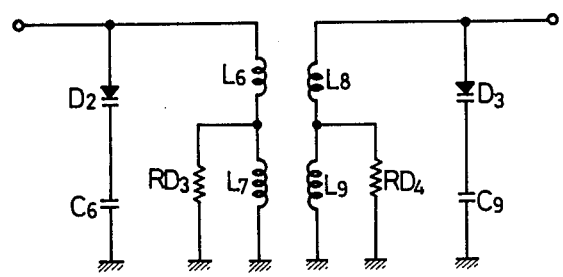
FIG. 8 shows an equivalent circuit for the circuit in the dotted line of FIG. 7 when the UHF band is being received.

In FIG. 8, the same symbols or numerals as those of FIG. 7 represent similar elements, and the diodes $SD_3$ and $SD_4$ which function as resistors are denoted as resistors $RD_3$ and $RD_4$. The resistors $RD_3$ and $RD_4$ work as dampers for the tuning circuit and the value of the tuning circuit therefore is decreased. Accordingly, the signals in the VHF band will not be added to the mixer circuit MIX and the reception of the UHF band is not affected by the VHF band. In this case, the resistances of the resistors $RD_3$ and $RD_4$ are determined by the resistance of the resistor $R_8$. Therefore, by suitably setting the resistance $R_8$, the Q value in the tuning circuit can be decreased to an appropriate value. Besides, since the potential as the point B is small, the high-frequency amplifier circuit RF AMP and the local oscillating circuit OSC do not operate.

Figure 9:
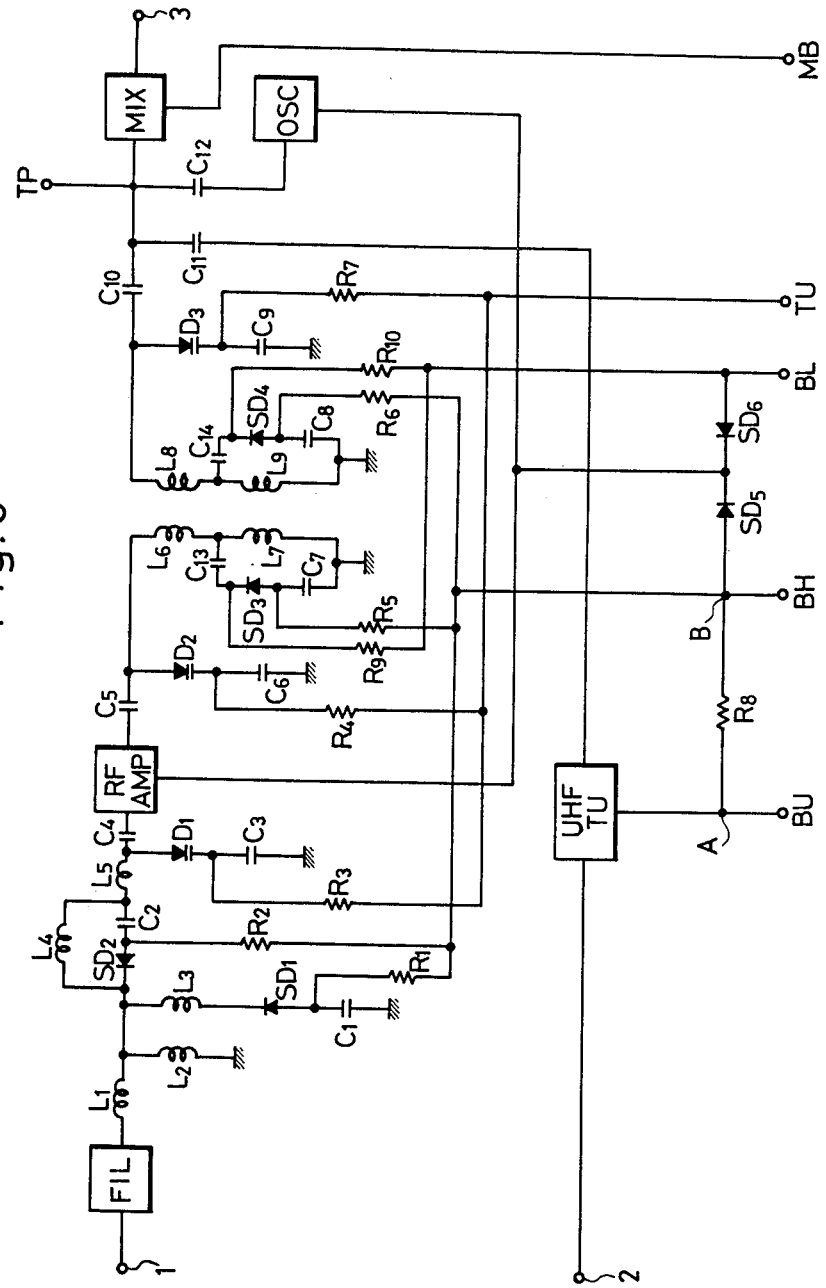
FIG. 9 is a circuit diagram of an electronic tuner according to another embodiment of the present invention.
Figure 10:
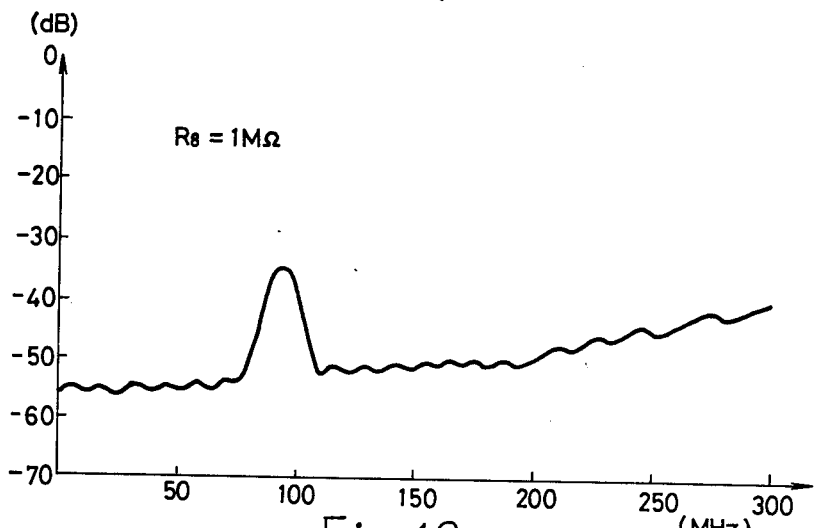
FIGS. 10A, 10B and 10C show attenuation characteristics of input signals as measured at the test probe terminal TP of FIG. 9.
FIG. 10D shows attenuation characteristics of input signals as measured at the test probe terminal TP of FIG. 11.
Figure 10:
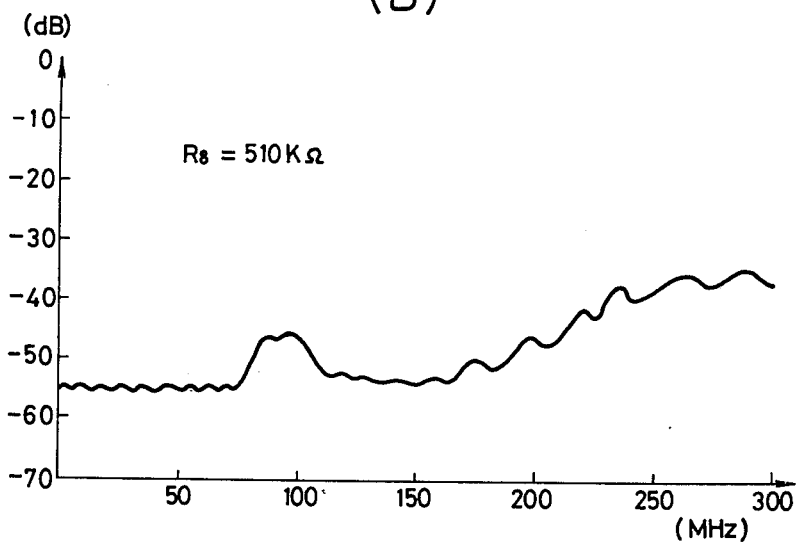
Figure 10:
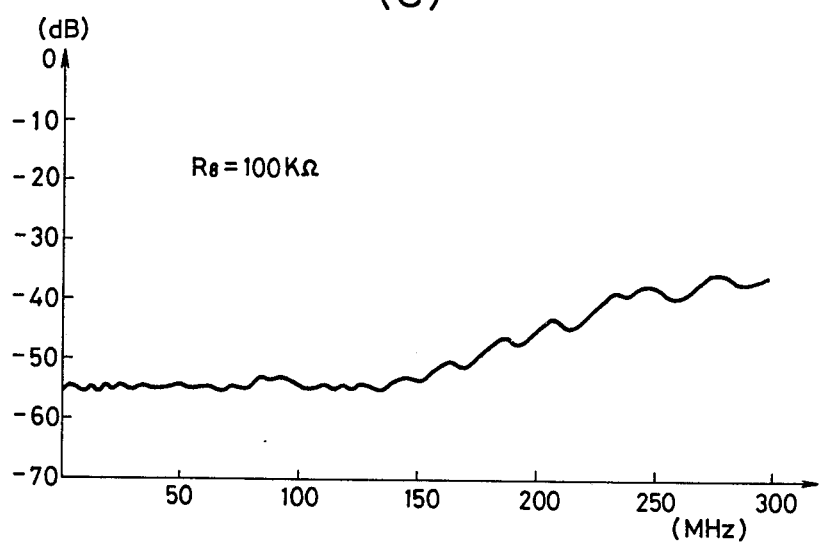
Figure 10:
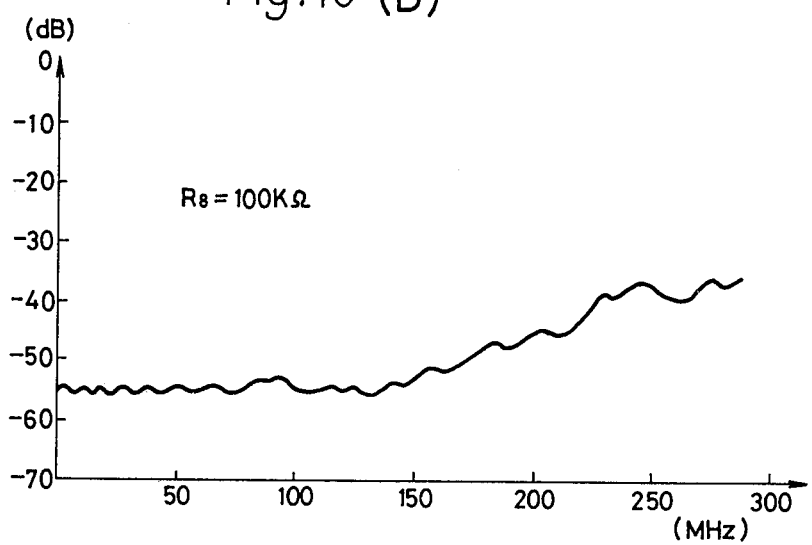

FIG. 9 is a circuit diagram according to another embodiment of the present invention, which corresponds to the conventional example shown in FIG. 6 except that the resistor $R_8$ is connected between the power supply terminals BU and BH.

According to this embodiment, when a voltage of, for example, $+15$ volts is applied to the power supply terminals MB and BU to supply operation current to the mixer circuit MIX and the UHF tuner UHF TU, so that the tuner circuit acquires the state to receive the UHF band, a voltage will be applied to the point B via the resistor $R_8$. However, since the resistor $R_8$ is similar to that of FIG. 7 and thus has a great resistance, the voltage at the point B is very small and the voltage applied to the diodes $SD_1$ to $SD_4$ is very small also. The diodes $SD_1$ to $SD_4$, therefore, are not completely rendered conductive and work as damper resistors for the tuning circuits. Hence, the Q value in the tuning circuit is decreased to reduce the passage of signals introduced from the VHF input terminal via coupling capacitors or the like. It is therefore possible to prevent the reception of the UHF band from being interfered by the VHF band.

FIGS. 10A, B and C show attenuation characteristics of input signals introduced from the VHF input terminal 1 as measured at the TP (test probe) terminal by changing the resistance of the resistor $R_8$ to 1 megohm, 510 Kohms and 100 Kohms, respectively. A comparison with FIG. 5, indicates reduced effects by the VHF band.

FIG. 11 is a circuit diagram according to a further embodiment of the present invention, which corresponds to the conventional example of FIG. 4, except that a resistor $R_8$ similar to those of the other embodiments of the present invention is connected in place of the diode $SD_7$. When a voltage is applied to the power supply terminal BU and MB so that the tuner can receive the UHF band, a small current is allowed to flow into the diodes $SD_1$ to $SD_4$ via the resistor $R_8$ and the diodes $SD_1$ to $SD_4$ function as damper resistors for the tuning circuit. FIG. 10D shows attenuation characteristics of the input signals introduced from the VHF input terminal 1 as measured at the TP (test probe) terminal for this embodiment. Here, the resistance $R_8$ has been set to be 100 kiloohms.

As will be understood from the FIGS. 10A–D, the resistance $R_8$ should desirably be about 100 Kohms. The resistance $R_8$, however, may be changed depending upon the diodes $SD_1$ to $SD_4$ and other circuit constants. In other words, when the UHF band is to be received, the resistance $R_8$ should be so selected that a small current is supplied to the diodes $SD_1$ to $SD_4$ in order that the diodes $SD_1$ to $SD_4$ will function as damper resistors for the tuning circuit.

Examples of the components that may be used are listed below:

| Resistors (in Kohms) | |
| --- | --- |
| $R_1$:4.7 | |
| $R_2$:4.7 | |
| $R_3$:33 | |
| $R_4$:33 | |
| $R_5$:4.7 | (2.0 in FIGS. 4, 6, 9, and 11) |
| $R_6$:4.7 | (2.0 in FIGS. 4, 6, 9, and 11) |
| $R_7$:33 | |
| $R_8$:100 | |
| $R_9$:2.7 | |
| $R_{10}$:2.7 | |

| Capacitors (in picofarads) | |
| --- | --- |
| $C_1$:1000 | $C_7$:1000 |
| $C_2$:5 | $C_8$:1000 |
| $C_3$:1000 | $C_9$:1000 |
| $C_4$:30 | $C_{10}$:3 |
| $C_5$:30 | $C_{11}$:200 |
| $C_6$:1000 | $C_{12}$:1.5 |

| Inductors (in nanohenrys) | |
| --- | --- |
| $L_1$:60 | $L_6$:60 |
| $L_2$:100 | $L_7$:300 |
| $L_3$:30 | $L_8$:60 |
| $L_4$:250 | $L_9$:300 |
| $L_5$:20 | |

| Diodes | |
| --- | --- |
| $D_1$, $D_2$, $D_3$,:152208 | $SD_1$, $SD_2$, $SD_3$, $SD_4$,:152222 |

As mentioned above, the electronic tuners of the present invention are equipped with a UHF tuner and a VHF tuner and are able to switch between a low frequency band and a high frequency band in the VHF band by way of switching diodes. A resistor $R_8$ of preferably 100 Kohms is connected between a terminal which applies a forward biasing voltage to the switching diodes when the high channel is being received and a terminal which supplies an operation voltage to the UHF tuner when the UHF band is being received, and a small current is thus supplied to the switching diodes of the tuning circuit for receiving the VHF band even when the UHF band is being received. In this way, the switching diodes will function as damper resistors for the tuning circuit, whereby the Q value of the tuning circuit is decreased to prevent the reception of the UHF band from being interfered by the VHF band.

What is claimed is:

1. In an electronic tuner having a VHF tuning portion including a resonant circuit having a switching diode for switching between a band of the lower channels of the VHF band and a band of the higher channels of the VHF band, and a UHF tuning portion, the improvement comprising damper means connected to said switching diode for supplying a voltage partially biasing said switching diode during operation of the UHF tuning portion whereby said switching diode will provide a resistance damping said resonant circuit.

2. An electric tuner according to claim 1 including a plurality of said resonant circuits.

3. An electronic tuner according to claims 1 or 2, said VHF tuner portion further including a variable capacitance diode and a plurality of inductors one of which being connected in parallel with said switching diode for each resonant circuit and means connected to each said switching diode for biasing it forwardly during reception of said band of upper VHF channels only, whereby said one inductance will be switched out of said receiving circuit.

4. An electronic tuner according to claim 3, including enabling means connected with said UHF tuning portion for supplying a voltage enabling it during reception of channels in the UHF band, said damper means including a resistor connected between said enabling means and said biasing means.

5. An electronic tuner according to claim 4, said resistor having a value of approximately 100 Kohms.

6. An electronic tuner according to claim 4, said resistor having a resistance sufficiently high to prevent enabling of said UHF tuning portion during reception of said band of upper VHF channels by said VHF tuning portion.

* * * * *